United States Patent
Chen et al.

(10) Patent No.: US 6,950,359 B2
(45) Date of Patent: Sep. 27, 2005

(54) MEMORY BIT LINE LEAKAGE REPAIR

(75) Inventors: Nan Chen, San Diego, CA (US); Cheng Zhong, San Diego, CA (US); Mehdi Hamidi Sani, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 123 days.

(21) Appl. No.: 10/403,101

(22) Filed: Mar. 28, 2003

(65) Prior Publication Data

US 2005/0073893 A1 Apr. 7, 2005

Related U.S. Application Data

(60) Provisional application No. 60/419,287, filed on Oct. 16, 2002.

(51) Int. Cl.⁷ .................................................. G11C 7/00
(52) U.S. Cl. ...................... 365/203; 365/154; 365/206
(58) Field of Search ................................ 365/203, 154, 365/206

(56) References Cited

U.S. PATENT DOCUMENTS

| | | | |
|---|---|---|---|
| 4,943,960 A | 7/1990 | Komatsu et al. | |
| 5,673,231 A | 9/1997 | Furutani | |
| 5,757,816 A | 5/1998 | Al-Assadi et al. | |
| 5,835,429 A | 11/1998 | Schwarz | |
| 5,923,601 A | 7/1999 | Wendell | |
| 2002/0089879 A1 | 7/2002 | Kobayashi et al. | |
| 2004/0042333 A1 * | 3/2004 | Shore et al. | 365/203 |

FOREIGN PATENT DOCUMENTS

EP          0642137          8/1994

* cited by examiner

*Primary Examiner*—Huan Hoang
(74) *Attorney, Agent, or Firm*—Philip R. Wadsworth; Charles D. Brown; Kenyon S. Jenckes

(57) ABSTRACT

Techniques for replacing and eliminating paths causing channel leakage current. In one embodiment, one or more precharge enable transistors and a precharge enable signal are added to a circuit configuration. The precharge enable transistors are designed to remain on and simply pass a signal in a properly functioning path. When a leakage path is identified, such as during IDDQ testing, the precharge enable signal is set to turn off the precharge enable transistors. When the precharge enable transistors are off, the leakage path is disrupted, and the leakage current stopped. The path may be replaced with a redundant path.

7 Claims, 4 Drawing Sheets

MEMORY BIT LINE LEAKAGE REPAIR

RELATED APPLICATIONS

This application claims benefit of U.S. Provisional Patent Application No. 60/419,287, filed Oct. 16, 2002 and entitled "MEMORY BIT LINE LEAKAGE REPAIR FOR COLUMN REDUNDANCY."

FIELD

The present application relates to replacing and eliminating a path causing channel leakage current.

BACKGROUND

Testing techniques for VLSI circuits are undergoing many changes. The predominant method for testing digital circuits consists of applying a set of input stimuli to the IC and monitoring the logic levels at primary outputs. If, for one or more inputs, there is a discrepancy between the observed output and the expected output then the IC is declared to be defective.

A new approach to testing digital circuits is known as IDDQ testing. In IDDQ testing, the steady state supply current, rather than the logic levels is monitored at the primary outputs. Research suggests that IDDQ testing can significantly improve the quality and reliability of fabricated circuits.

IDDQ testing is a test technique based on measuring the quiescent supply current of the device under test. The decision criterion is based on the fact that a CMOS circuit does not draw any significant current when in a stable situation. In a quiescent state only the leakage current flows, which may typically be neglected. The fact that under certain conditions a significant current flows when the device under test is in a quiescent state indicates the presence of a manufacturing defect in the circuit. A defect capable of causing a current increase can directly influence the functionality of the circuit (functional failure) or otherwise negatively effect the lifetime and reliability of the circuit ((early) lifetime failure).

As devices continue to scale down into the deep submicron region, leakage current becomes more sensitive to the process. Usually, a big channel leakage current introduced by defects in the SRAM bit cell, for example, the pass transistor defect, may cause functionality and IDDQ failures in the SRAM. Among these two failures, IDDQ failure contributes to a large portion of SRAM yield loss, especially for chips used in the portable device which is sensitive to the leakage. In a conventional column redundancy scheme, only the functionality failure can be fixed by replacing the failed column with a good one. However, the IDDQ failure is still there because the leakage path exists in the failed column.

It is desirable to not only replace a failed column with a good column, but also to be able to eliminate the leakage contributing to, for example, an IDDQ failure.

SUMMARY

The present disclosure describes techniques for replacing and eliminating paths causing channel leakage current. In one embodiment, one or more precharge enable transistors and a precharge enable signal are added to a circuit configuration. The precharge enable transistors are designed to remain on and simply pass a signal in a properly functioning path. When a leakage path is identified, such as during IDDQ testing, the precharge enable signal is set to turn off the precharge enable transistors. When the precharge enable transistors are off, the leakage path is disrupted, and the leakage current stopped. The path may be replaced with a redundant path.

These and other features and advantages of the embodiments will become more apparent upon reading the following detailed description and upon reference to the accompanying drawings.

DETAILED DESCRIPTION

Figure 1:
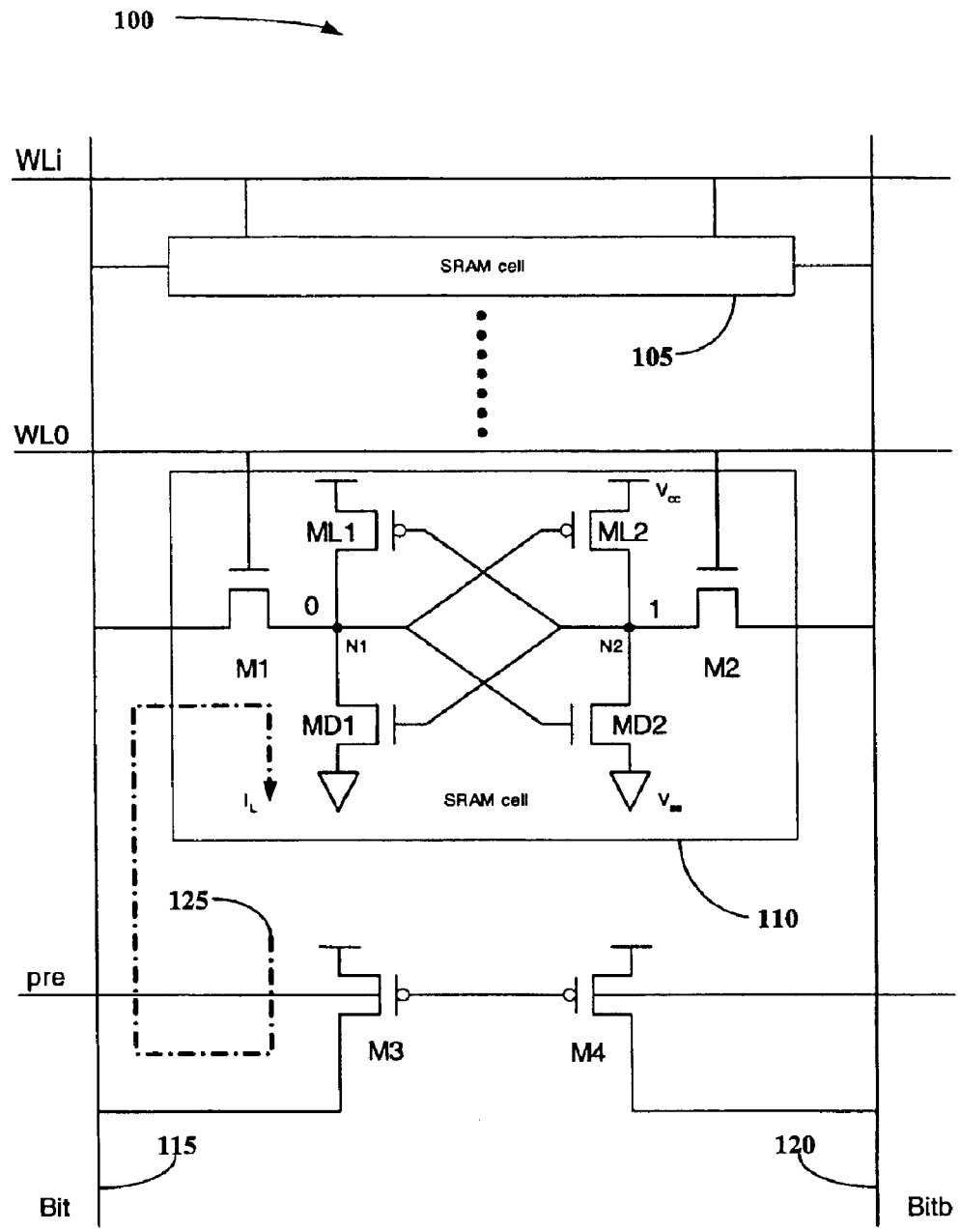
FIG. 1 illustrates a leakage path in a conventional SRAM precharge circuit.

FIG. 1 is a circuit diagram a conventional SRAM precharge circuit 100. The circuit consists of a plurality of Static Random Access Memory (SRAM) memory cells 105 and precharge transistors M3 and M4. Each of the memory cells 105 is connected to a word line (WLi, WL0), a first bit line 115, and a second bit line 120. A detailed diagram is provided of one of the SRAM cells 110. The CMOS SRAM cell is formed of a pair of driver transistors MD1 and MD2, a pair of transfer transistors M1 and M2, and a pair of load transistors ML1 and ML2. Here, the pair of driver transistors TD1 and TD2, and the pair of transfer transistors M1 and M2 are NMOS transistors. The pair of load transistors ML1 and ML2 are typically PMOS transistors.

A first driver transistor MD1 and a first transfer transistor M1 are connected in series with each other. A source area of the first driver transistor MD1 is connected to a ground line $V_{ss}$, and a drain area of the first transfer transistor M1 is connected to a first bit line 115. Similarly, a second driver transistor MD2 and a second transfer transistor M2 are also connected in series with each other. Also, a source area of the second driver transistor MD2 is connected to the ground line $V_{ss}$, and a drain area of the second transfer transistor M2 is connected to a second bit line 120. The first and second bit lines 115, 120 maintain opposite information.

A source area and a drain area of a first load transistor ML1 are connected to a power line $V_{cc}$ and a drain area of the first driver transistor TD1, namely, a first node N1, respectively. Similarly, a source area and a drain area of a second load transistor ML2 are connected to the power line $V_{cc}$ and a drain area of the second driver transistor TD2, namely, a second node N2, respectively. A gate electrode of the first driver transistor MD1 and a gate electrode of the first load transistor ML1 are connected to the second node N2, and a gate electrode of the second driver transistor MD2 and a gate electrode of the second load transistor ML2 are connected to the first node N1. Also, gate electrodes of the first and second transfer transistors M1 and M2 are connected to a word line WL.

During the standby period, the precharge signal (pre) goes low and turns on the precharge transistors M3 and M4. If the pass transistor M1 has defects causing a low channel impedance and a data "0" was stored at node N1, a leakage path 125 is created. The leakage path 125 is from $V_{cc}$ through the precharge transistor M3, through the transfer transistor M1, through the driver transistor MD1 to $V_{ss}$. The leakage path 125 introduces a large channel leakage current $I_L$ results in an IDDQ failure in the SRAM. Even though an identified failed column may be replaced by a functionally good column, the leakage current $I_L$ still remains in the relevant circuit (leakage) path.

Figure 2:
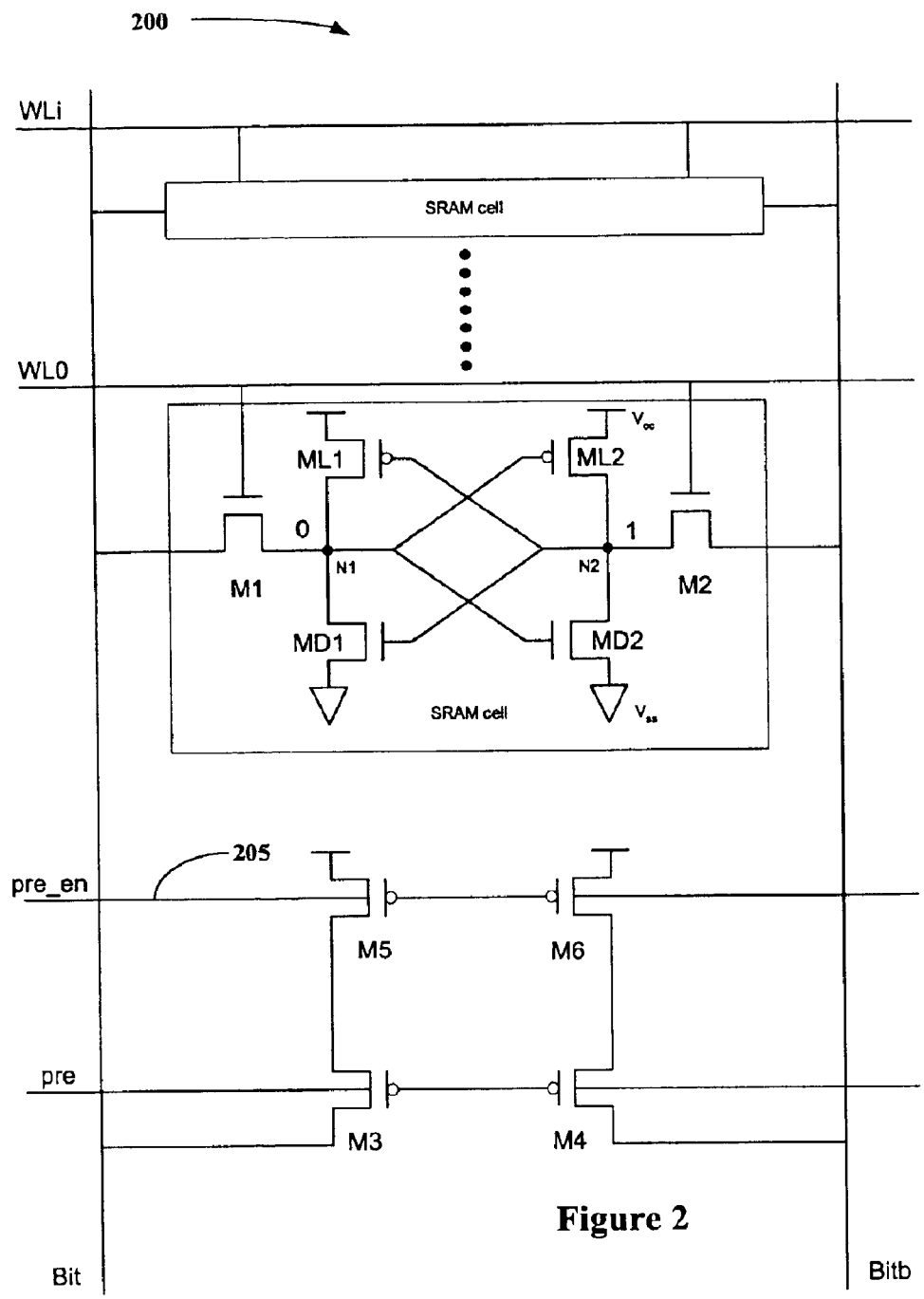
FIG. 2 is a circuit diagram of a SRAM precharge circuit configured to remove the leakage path from the circuit in accordance with an embodiment of the invention.

FIG. 2 is a circuit diagram, in accordance with an embodiment of the invention, of a modified SRAM precharge circuit 200 configured to remove the leakage path from a circuit, such as that in FIG. 1. In the modified circuit 200, two precharge enable transistors M5 and M6 and a precharge enable signal 205 are added. The source of the precharge enable transistor M5 is connected to the power line and the drain of the precharge enable transistor M5 is connected to the source of the precharge transistor M3. The source of the precharge enable transistor M6 is connected to the power line and the drain of the precharge enable transistor M6 is connected to the source of the precharge transistor M4.

The precharge enable signal 205 is associated with the fuse control logic and each column has a distinct precharge signal. If there is no column replacement, the precharge enable signal 205 remains low through the fuse logic, thus ensuring that the precharge enable transistors M5 and M6 are always on. In this circumstance, the precharge enable transistors M5 and M6 simply pass any signals, so the column works as if the precharge enable transistors M5 and M6 were not there. However, if a column is replaced because of a defect, the precharge enable signal 205 is set high through the fuse logic. In this situation, high precharge enable signal 205 turns off the precharge enable transistors M5 and M6, effectively opening the circuit between the precharge transistor M3 and the transfer transistor M1. By turning off the precharge enable transistors M5 and M6, the leakage path is interrupted, and therefore the IDDQ failure is removed from the circuit.

Figure 3:
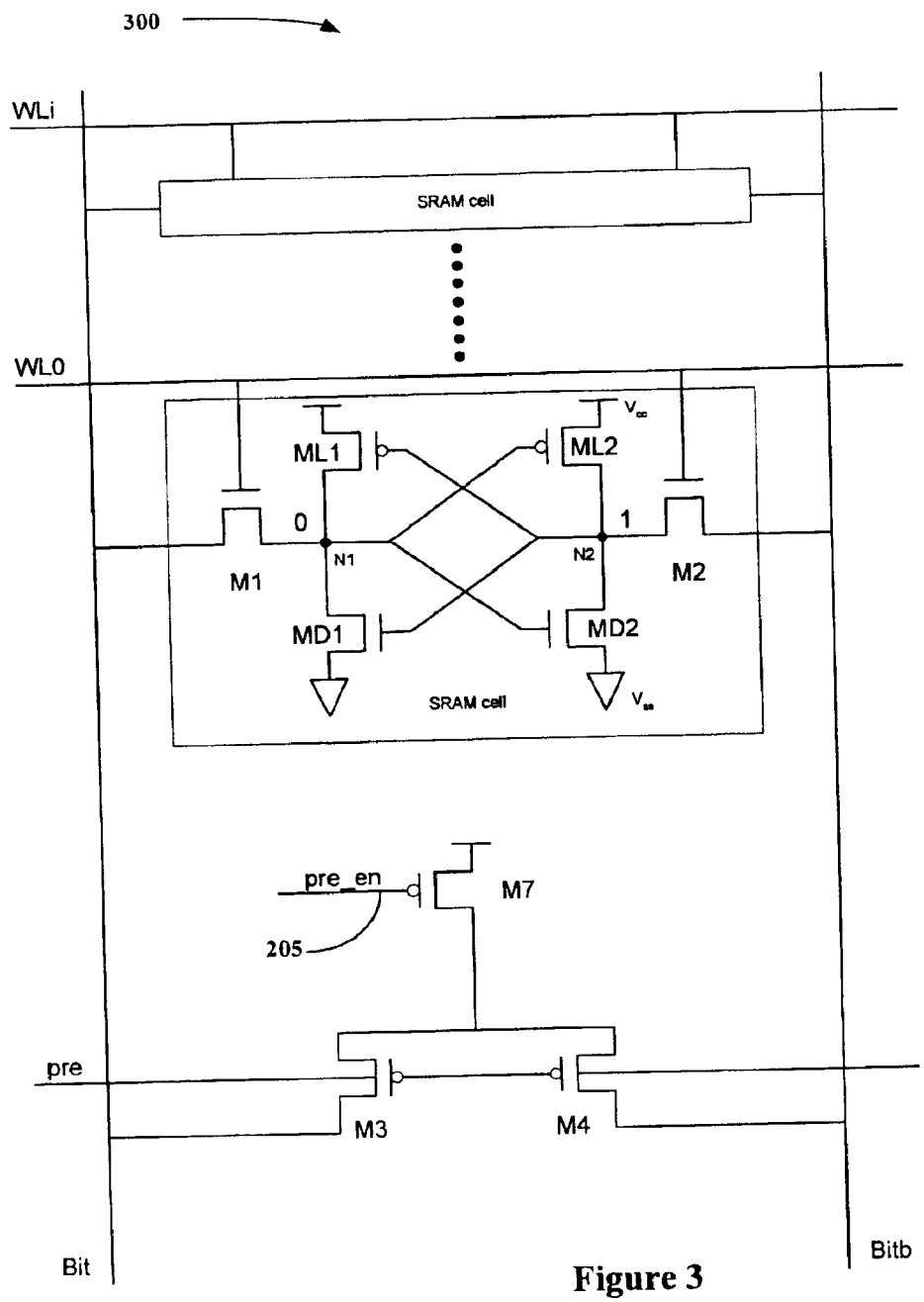
FIG. 3 is an alternative design of a SRAM precharge circuit configured to remove the leakage path from the circuit.

FIG. 3 is a modified SRAM precharge circuit 300 configured to remove the leakage path from the circuit, in accordance with an alternate embodiment. In the modified circuit 300, a single precharge enable transistor M7 and the precharge enable signal 205 are added. The source of the precharge enable transistor M7 is connected to the power line and the drain of the precharge enable transistor M7 is connected to the source of the precharge transistors M3 and M4. If there is no column replacement, the precharge enable signal 205 remains low through the fuse logic, thus ensuring that the precharge enable transistor M7 remains on so any signals are passed. If a column is replaced because of a defect, the precharge enable signal 205 is set high through the fuse logic. In this situation, the high precharge enable signal 205 turns off the precharge enable transistor M7, effectively interrupting the leakage path and removing the IDDQ failure from the circuit. By using only one precharge enable transistor M7, more precharge balance is achieved.

Figure 4:
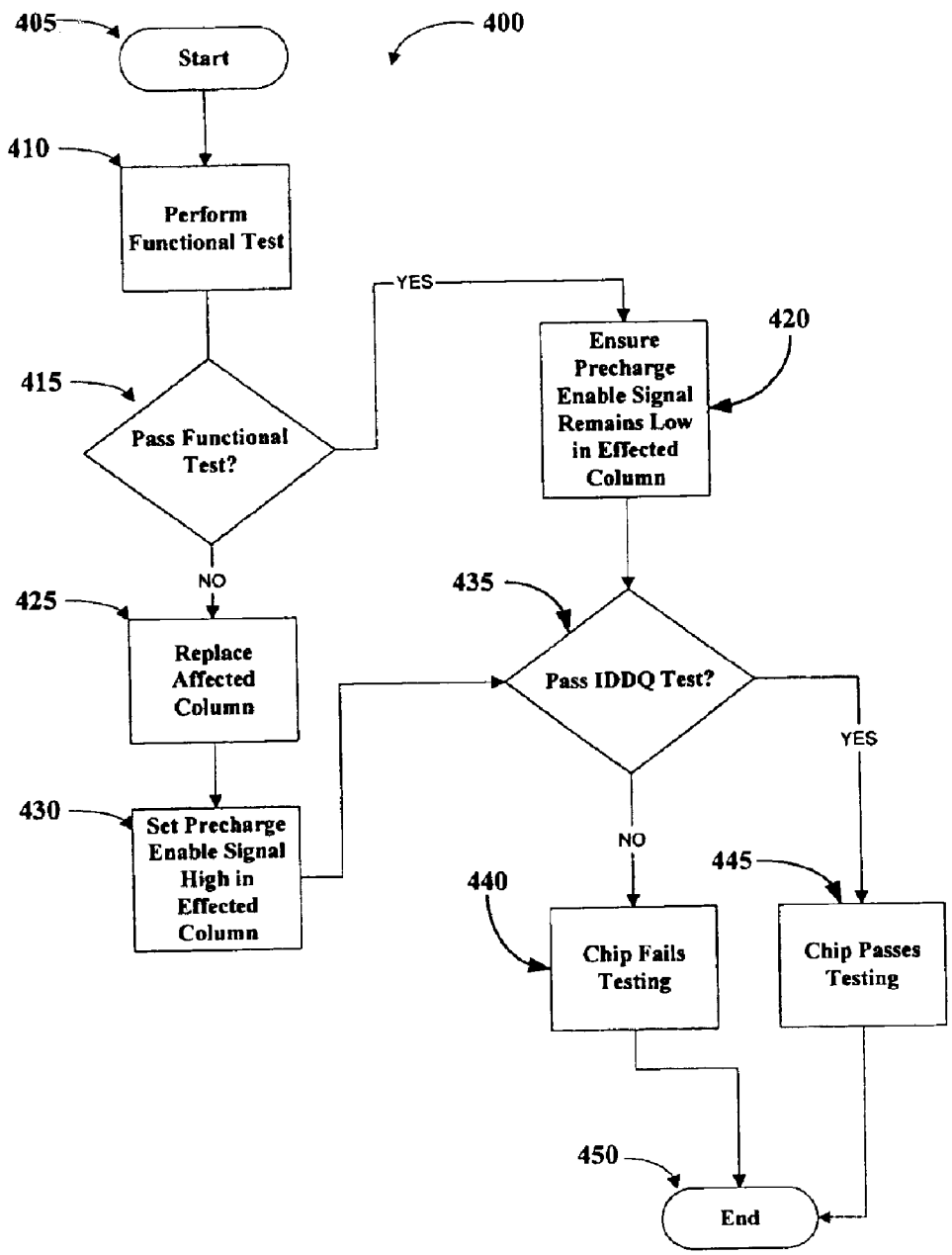
FIG. 4 illustrates a process for detecting and repairing errors on memory wafers in accordance with one embodiment of the invention.

FIG. 4 illustrates a process 400 for detecting and repairing errors, employing the principles of the various embodiments disclosed herein, on memory wafers. The process 400 begins in START block 405. Proceeding to block 410, a functional test is performed on a memory chip on the wafer to determine if any errors are present in the memory column.

Proceeding to block 415, the process 400 determines if the circuit passed the functional test. The functional test determines if the memory column is operating properly. The functional test may not specifically identify any particular cause of a failure. If the circuit passes functional testing, the process 400 proceeds along the YES branch to block 420. In block 420, the process 400 ensures the precharge enable signal remains low. By having the precharge enable signal low, the precharge enable transistors M5, M6, or M7 (FIGS. 2–3) remain on, effectively passing any signals to the precharge transistors M3 and M4. This allows the circuit to operate normally. The process 400 then proceeds to block 435 for IDDQ testing, which will be discussed below.

Returning to block 415, if the circuit fails functional testing, the process 400 proceeds along the NO branch to block 425. In block 425, the process 400 replaces the effected column with a redundant column. By replacing the effected column, the functionality of the column can be maintained in the circuit. The circuit may be designed with a plurality of redundant columns to allow for replacement of any columns failing the functional test.

Proceeding to block 430, the process 400 sets the precharge enable signal to a high state. By having the precharge enable signal high, the precharge enable transistors M5, M6, or M7 turn off, effectively removing the precharge transistors M3 and M4 from the circuit. By removing the precharge transistors M3 and M4, the path for any potential leakage current to flow is removed, and therefore any leakage current in the memory column is repaired. Thus, the column functionality may be replaced with a redundant column, and the defect in the column removed from the circuit using the precharge enable signal and the precharge enable transistors M5, M6, or M7.

Proceeding to block 435, IDDQ testing is performed on the memory chip on the wafer. IDDQ testing measures the quiescent supply current of the device under test. A CMOS circuit does not draw any significant current when in a stable situation. In a quiescent state only the leakage current flows, which may typically be neglected. IDDQ testing measures whether a significant current flows in the device under test. If a precharge transistor (such as precharge transistor M3, FIG. 2) is defective, current may flow through the precharge transistor at all times. This current, known as the leakage current, is detected during the IDDQ test. If the circuit is operating properly and all the malfunctioning memory columns were replaced and removed from the circuit with the precharge enable transistors, no leakage current will be present and the process 400 proceeds along the YES branch to block 445. In block 445, the memory chip on the wafer is determined to be operating properly with any defects repaired. The process 400 then terminates at END block 450.

Returning to block 435, if the memory chip on the wafer fails IDDQ testing, the process 400 proceeds along the NO branch to block 440. In block 440, the memory chip on the wafer fails the testing procedure and is determined to be defective. This memory chip may then be discarded before any expensive packaging is performed. After identifying any defective memory chips on the wafer, the process 400 terminates in END block 450.

Although the present device has been fully described in connection with the preferred embodiments thereof with reference to the accompanying drawings, it is to be noted that various changes and modifications will become apparent to those skilled in the art. Such changes and modifications are to be understood as being included within the scope of the present device as defined by the appended claims.

What is claimed is:

1. An SRAM device comprising:
   an electronic circuit, the electronic circuit comprising a memory cell;
   a precharge transistor in electrical communication with the electronic circuit;

a precharge enable transistor connected to the electronic circuit and the precharge transistor, wherein when open the precharge enable transistor disconnects the electronic circuit from the precharge transistor and when closed, the precharge enable transistor passes signals between the electronic circuit and the precharge transistor; and a precharge enable signal to control the precharge enable transistor, the precharge enable signal is set to close the precharge enable transistor by default, and wherein the precharge enable signal permanently opens the precharge enable transistor upon failure of IDDQ testing.

2. The device of claim 1, wherein the precharge enable transistor is connected to more than one precharge transistor.

3. A memory device comprising:

a plurality of memory cells, wherein each of the plurality of memory cells is connected to associated precharge enable transistors; and a precharge enable signal to control the precharge enable transistors for each of the plurality of memory cells, the precharge enable signal opening the precharge enable transistors to disconnect one of the plurality of memory cells from a corresponding precharge enable transistor when a leakage current fault is detected, wherein the precharge enable signal is set to close the precharge enable transistor by default, and wherein the precharge enable signal permanently opens the precharge enable transistor upon failure of IDDQ testing.

4. The device of claim 3, wherein a precharge enable transistor is associated with at least two precharge transistors.

5. A method of removing leakage current from an SRAM memory cell comprising:

identifying a path causing leakage current by performing an IDDQ test;

disconnecting a precharge enable transistor associated with the path;

establishing a redundant path; and setting a precharge enable signal to permanently disconnect the precharge enable transistor.

6. An SRAM memory device comprising:

an electronic circuit, the electronic circuit comprising a memory cell;

a precharge enable transistor in electrical communication with the electronic circuit;

means for detecting a fault based on an IDDQ test; and means for permanently disconnecting the electronic circuit from the precharge enable transistor when a fault is detected.

7. The device of claim 6, wherein the means for disconnecting controls more than one precharge enable transistor.

* * * * *